(12) United States Patent
Butzer et al.

(10) Patent No.: US 7,832,619 B2
(45) Date of Patent: Nov. 16, 2010

(54) METHOD OF MAKING SPUTTERING TARGET

(75) Inventors: Greg A. Butzer, Whitehall, MI (US); Robert H. Huizenga, Muskegon, MI (US); Steven D. Mussman, North Muskegon, MI (US)

(73) Assignee: Howmet Corporation, Cleveland, OH (US)

( * ) Notice: Subject to any disclaimer, the term of this patent is extended or adjusted under 35 U.S.C. 154(b) by 1024 days.

(21) Appl. No.: 11/062,777

(22) Filed: Feb. 22, 2005

(65) Prior Publication Data

US 2005/0189401 A1 Sep. 1, 2005

Related U.S. Application Data

(60) Provisional application No. 60/548,790, filed on Feb. 27, 2004, provisional application No. 60/603,528, filed on Aug. 20, 2004.

(51) Int. Cl.
*B23K 20/00* (2006.01)
(52) U.S. Cl. ..................................... 228/193
(58) Field of Classification Search ............... 228/193, 228/195
See application file for complete search history.

(56) References Cited

U.S. PATENT DOCUMENTS

| | | | |
|---|---|---|---|
| 3,714,702 A | 2/1973 | Hammond | 29/494 |
| 4,594,219 A * | 6/1986 | Hostatter et al. | 419/8 |
| 6,199,747 B1 | 3/2001 | Cohn et al. | 228/119 |
| 2004/0009087 A1 | 1/2004 | Yi et al. | |
| 2004/0108028 A1 * | 6/2004 | Guo et al. | 148/676 |

FOREIGN PATENT DOCUMENTS

| | | |
|---|---|---|
| CN | 1370853 A1 | 9/2002 |
| EP | 285130 A | 10/1988 |
| EP | 590904 A | 4/1994 |
| EP | 902102 A | 3/1999 |
| JP | 06 264233 A | 9/1994 |
| JP | 2003129232 | 5/2003 |
| JP | 2003 342720 A | 12/2003 |

OTHER PUBLICATIONS

Hirakawa et al. JP 2003-129232 which published on May 2003, Certified Translation of the Japanese document.*

* cited by examiner

*Primary Examiner*—Jessica L Ward
*Assistant Examiner*—Nicholas P D'Aniello

(57) ABSTRACT

A method of making a large Mo billet or bar for a sputtering target wherein two or more bodies comprising Mo are placed adjacent one another (e.g. stacked one on the other) with Mo powder metal present at gaps or joints between the adjacent bodies. The adjacent bodies are hot isostatically pressed to form a diffusion bond at each of the metal-to-Mo powder layer-to-metal joint between adjacent bodies to form a billet or bar that can be machined or otherwise formed to provide a large sputtering target. The number and dimensions of the Mo bodies placed adjacent one another are selected to yield a desired large size the billet or bar suitable for the sputtering target. The billet or bar for the sputtering target exhibits a microstructure comprising equiaxed grains of less than 30 microns grain size and exhibits a low oxygen content of less than about 100 ppm by weight.

6 Claims, 2 Drawing Sheets

METHOD OF MAKING SPUTTERING TARGET

This application claims benefits and priority of provisional application Ser. No. 60/548,790 filed Feb. 27, 2004, and provisional application Ser. No. 60/603,528 filed Aug. 20, 2004.

FIELD OF THE INVENTION

The present invention relates to a method of making a large billet or bar comprising molybdenum (Mo) for a sputtering target and to the billet and sputtering target produced by the method.

BACKGROUND OF THE INVENTION

The current method of making a large molybdenum sputtering target is to cold isostatic press (CIP) Mo powder, sinter to reduce the oxygen content and then hot roll to a plate length/width/thickness desired. The plate then is machined to final tolerance. Mo sputtering targets made using the CIP, sinter and roll process are disadvantageous due to the sputter yield of the target and of the etching characteristics of the deposited thin film. This is related to the plate microstructure that is formed during the rolling process.

SUMMARY OF THE INVENTION

The present invention provides in an illustrative embodiment a method of making a billet or bar comprising molybdenum (Mo) for a sputtering target wherein two or more sintered powder metal bodies (e.g. ingot bodies) comprising Mo are placed adjacent one another (e.g. stacked one on the other) with powder metal comprising Mo present at joints between adjacent bodies. The adjacent bodies are hot isostatically pressed to form a diffusion bond at each metal-to-powder metal layer-to-metal joint between adjacent bodies. This forms a billet or bar that can be machined or otherwise formed to provide a large sputtering target. The number and dimensions of the bodies placed adjacent one another are selected to yield a desired large size billet or bar suitable for the sputtering target. For example, a billet or bar having a length of over 3000 mm and cross-section of 225 mm by 225 mm can be provided by practice of the invention.

In another illustrative embodiment of the present invention, a method is provided for making a billet or bar comprising molybdenum (Mo) for a sputtering target wherein two or more sintered powder metal bodies comprising Mo are diffusion bonded together at one or more metal-to-metal joints therebetween in a first hot isostatic pressing operation to form a preform. Two or more preforms then are placed adjacent one another (e.g. stacked one on the other) with a powder metal layer comprising Mo present at joints between the adjacent preforms. The adjacent preforms are hot isostatically pressed in a second hot isostatic pressing operation to form a diffusion bond at each metal-to-powder metal layer-to-metal joint between adjacent preforms to form a billet or bar that can be machined or otherwise formed to provide a large sputtering target. The number and dimensions of the preforms placed adjacent one another are selected to yield a desired large size the billet or bar suitable for the sputtering target.

The billet or bar for the sputtering target exhibits a microstructure comprising equiaxed grains of desired small grain size (e.g. about 30 microns or less) and exhibits a low oxygen content of less than about 100 ppm (part per million by weight) as a result of use of low oxygen sintered Mo powder metal bodies. The billet or bar for the sputtering target includes a density greater than 99% of theoretical density and one or more diffusion bond joints where the metal powder was formerly present at the joints between adjacent bodies or preforms.

Other advantages, features, and embodiments of the present invention will become apparent from the following description.

DESCRIPTION OF THE INVENTION

Figure 1:
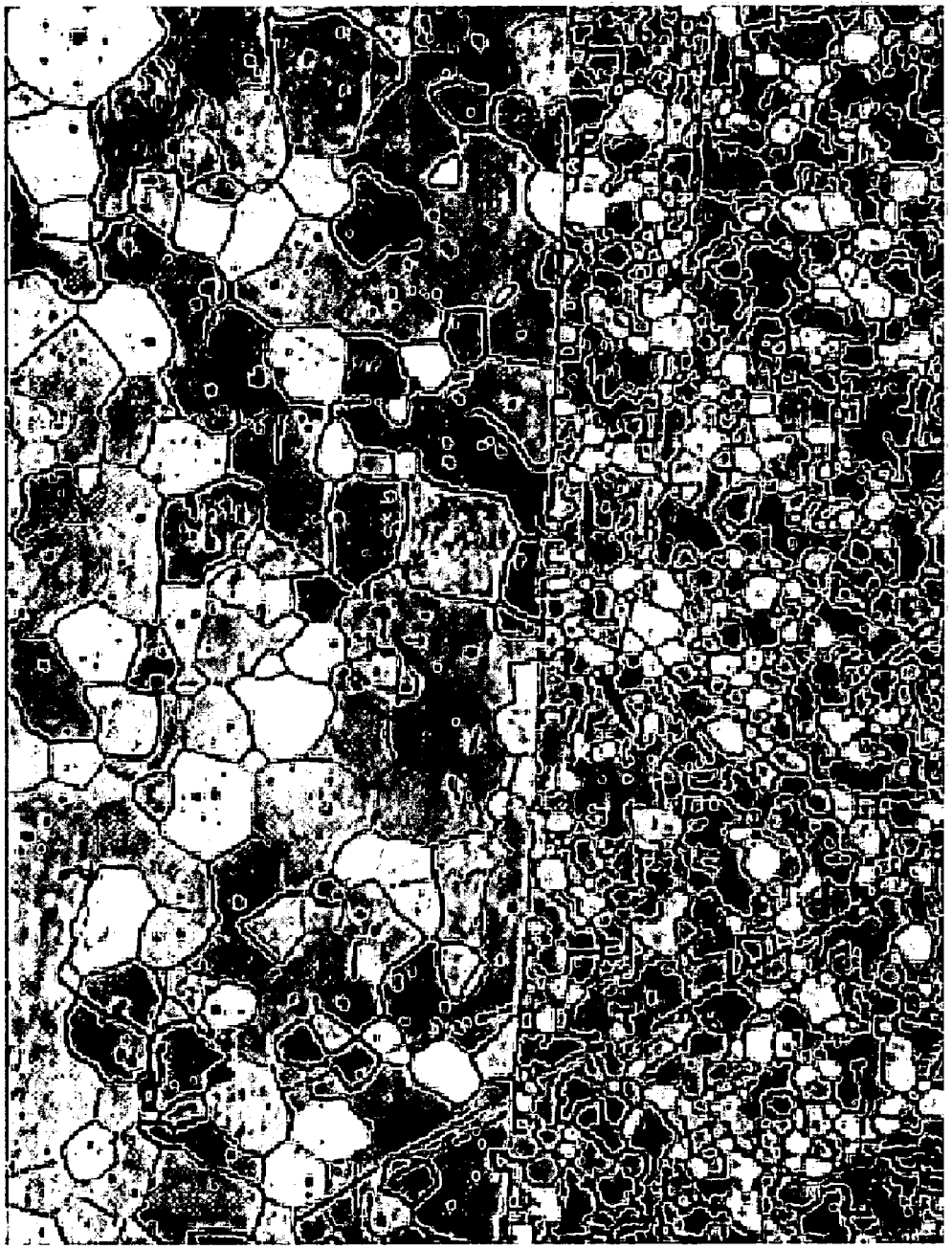
FIG. 1 is a photomicrograph at 100× of a metal-to powder metal layer-to-metal diffusion bond joint between sintered Mo powder metal ingot bodies.

The present invention provides a method of making an elongated body, such as a large billet or bar, comprising molybdenum (Mo) for a sputtering target. For purposes of illustration and not limitation, the method can be used to make a billet or bar for the sputtering target having a bar length of 3000 mm and above and bar cross-sectional dimensions of 225 mm by 225 mm (mm is millimeters) and less, although practice of the invention is not limited to any particular size billet/bar as any size may be made suitable for an intended target application. The billet or bar for the sputtering target exhibits a microstructure comprising equiaxed grains of desired small grain size (e.g. about 30 microns or less) and exhibits a low oxygen content of less than about 100 ppm (part per million by weight) as explained below. The billet or bar for the sputtering target includes a density of greater than 99% of theoretical density.

An illustrative embodiment of the method of the invention starts with sintered powder metal plate-shaped ingot bodies comprising Mo having an oxygen content of less than about 100 ppm (parts per million by weight). The ingot bodies are made by cold isostatic pressing (CIP) of commercially available Mo powders in a suitable rubber container to produce a pressed ingot body and then sintering the ingot body in a designated atmosphere (e.g. hydrogen) to reduce the oxygen content thereof to less than about 100 ppm by weight and increase the theoretical density thereof to greater than 94%. For purposes of illustration and not limitation, commercially available Mo powder having a particle size of 3 to 10 microns, purity of 99.95% by weight, and oxygen content typically of less than 1000 ppm by weight is loaded into a rubber bag and steel die to produce a near net shape ingot body when the rubber bag and steel die package with Mo powder therein are cold isostatically pressed (CIP) at room temperature at approprite pressure (e.g. 15 to 30 ksi gas pressure), although other CIP parameters may be used. The near net shape ingot body exhibits a density greater than 60% of theoretical density. An illustrative ingot body after CIP for one particular sputtering target application may have a size of 220 mm by 210 mm with about 600 mm thickness, although practice of the invention is not limited to any particular size CIP'ed ingot body as any size may be made suitable for an intended target application. For example, another illustrative ingot body after CIP may have a size of 220 mm by 210 mm with about 200 mm thickness. The CIP ingot body then is sintered. For purposes of illustration and not limitation, the CIP ingot body is induction sintered at an appropriate temperature and time in an appropriate atmosphere (e.g. at 1800 degrees C. for 18-24 hours in a partial hydrogen atmosphere) effective to reduce oxygen content of the CIP'ed ingot body to less than 100 ppm by weight, although other sintering parameters may be employed. The sintered Mo powder metal ingot body exhibits a density greater than 94% of theoretical density and 99.95% purity by weight basis with the above dimensions for purposes of illustration and not limitation. Such low oxygen ingot bodies can be purchased from H. C. Starck, Coldwater, Mich., in various shapes and dimensions suitable to make a desired sputtering target.

The next step in the method embodiment of the invention involves HIP'ing two or more of the ingot bodies under special joint conditions in a hot isostatic pressing operation to form a relatively large billet or bar for the sputtering target. For example, two ingot bodies described above have their outer top and bottom major side surfaces machined and cleaned. A HIP can of low carbon steel is provided having internal dimensions of 225 mm by 225 mm with a height of 2300 mm. One ingot body is placed in the HIP can with its machined major side surface facing sideways. A second ingot body is placed in the HIP can with its machined major side surface facing the major machined side of the first ingot body. A gap of approximately 6 mm is left between the ingot bodies. This process is repeated until the HIP can is full of ingot bodies arranged side-by-side. Then, commercially available Mo metal powder is sprinkled on the upwardly facing machined major side surface of, as well as optionally around edges, of the first preform in the HIP can. For purposes of illustration and not limitation, the Mo metal powder is placed as a layer in the gaps between the adjacent ingot bodies in the HIP can. The oxygen content of the commercially available Mo powder metal filling the gaps typically is less than 1000 ppm by weight.

Additional Mo metal powder may be placed about the edges of the ingot bodies to fill up any gaps between the HIP can and the ingot bodies. This process continues until all gaps have been filled. The remaining sidewall of the HIP can having an evacuation stem then is welded to the HIP can to seal it.

Before the HIP'ing operation, the HIP can is leak tested using helium gas through the stem on the welded sidewall. Several of the leak-tested HIP cans each with CIP'ed and sintered ingot bodies therein are placed in a degas oven and heated to an appropriate temperature (e.g. 600 degrees F.) while evacuating the HIP cans (e.g. to less than $10^{-5}$ torr) via the stems until an appropriate leak rate (e.g. less than 100 microns per minute) is attained. The HIP can is then placed in a conventional HIP vessel and HIP'ed at a temperature, pressure and time (e.g. 1236 degrees C. at a gas pressure of 1034 bar for 300 minutes) to effect diffusion bonding of the metal (Mo)-to-powder metal (Mo) layer-to-metal(Mo) at the joints between the adjacent ingot bodies to form a billet or bar, although other HIP parameters may be used. The number and dimensions of the ingot bodies HIP'ed are selected to yield a desired large size the billet or bar suitable for the sputtering target.

The final HIP'ed billet or bar for the sputtering target exhibits a microstructure comprising equiaxed grains of desired small grain size (e.g. about 30 microns or less) and exhibits a low oxygen content of less than about 100 ppm (part per million by weight) as a result of use of low oxygen sintered Mo powder metal ingot bodies and of the HIP process effecting diffusion of oxygen from the commercially available Mo powder metal at each joint between adjacent ingot bodies. For example, it is through the HIP process that the oxygen from the commercially available Mo powder metal joint diffuses into the low oxygen (less than 100 ppm O) ingot bodies, reducing the oxygen content in the joint to less than 100 ppm by weight. FIG. 1 shows the diffusion bond joint achieved at an initial metal(Mo)-to-powder metal(Mo) layer-to-metal(Mo) joint by the procedure set forth above. The billet or bar for the sputtering target thereby includes one or more diffusion bond joints where the Mo powder layer was formerly present in the gaps between the adjacent ingot bodies in the HIP can.

Pursuant to another method embodiment of the invention, two or more sintered Mo powder metal bricks (ingot bodies) of the type described above are diffusion bonded together at one or more metal-to-metal joints therebetween in a first hot isostatic pressing operation to form two or more preforms. The preforms then are placed adjacent one another (e.g. stacked one on the other) with a Mo powder layer present at joint(s) between adjacent preforms. The adjacent preforms are hot isostatically pressed in a second hot isostatic pressing operation to form a diffusion bond at each joint between the adjacent preforms to form a billet or bar that can be machined or otherwise formed to provide a large sputtering target. The number and dimensions of the preforms placed adjacent one another are selected to yield a desired large size billet or bar suitable for the sputtering target.

For purposes of illustration and not limitation, to form the preforms, two plate-shaped Mo powder bricks made as described above have their mating flat major side surfaces (i.e. largest area surfaces) machined to 180 to 220 RMS (root mean square) surface finish and cleaned to insure adequate metal-to-metal contact when the major side surfaces are placed in contact to form a metal-to-metal joint therebetween. Typically, the sintered bricks are stacked one atop the other in the form of a sandwich with a metal(Mo)-to-metal(Mo) joint between the major side surfaces thereof. The stacked sintered bricks are placed in a mild steel HIP can for hot isostatic pressing (HIP'ing). For example, the stacked sintered bricks can be placed on one end cover of the HIP can. Then, the top end cover of the HIP can is placed atop the stacked sintered bricks followed by placement of a sidewall of the HIP can between the top and bottom covers about the stacked sintered bricks. The sidewall then is welded in position to the top and bottom covers of the HIP can.

Before HIP'ing, the HIP can is leak tested using helium gas using stems welded on one end cover. Several of the leak-tested HIP cans each with the stacked sintered plate-shaped bricks therein are placed in a degas oven and heated to an appropriate temperature (e.g. 600 degrees F.) while evacuating the HIP cans (e.g. to less than $10^{-5}$ torr) via the stems until an appropriate leak rate (e.g. less than 100 microns per minute) is attained. The HIP cans then are placed in a conventional HIP vessel and HIP'ed at a temperature, pressure and time (e.g. 1400 degrees C. at a gas pressure of 1034 bar for 240 minutes) to effect metal(Mo)-to-metal(Mo) diffusion bonding between the machined major side surfaces of the Mo powder metal bricks, although other HIP temperatures, pressures, and times can be used.

Figure 2:
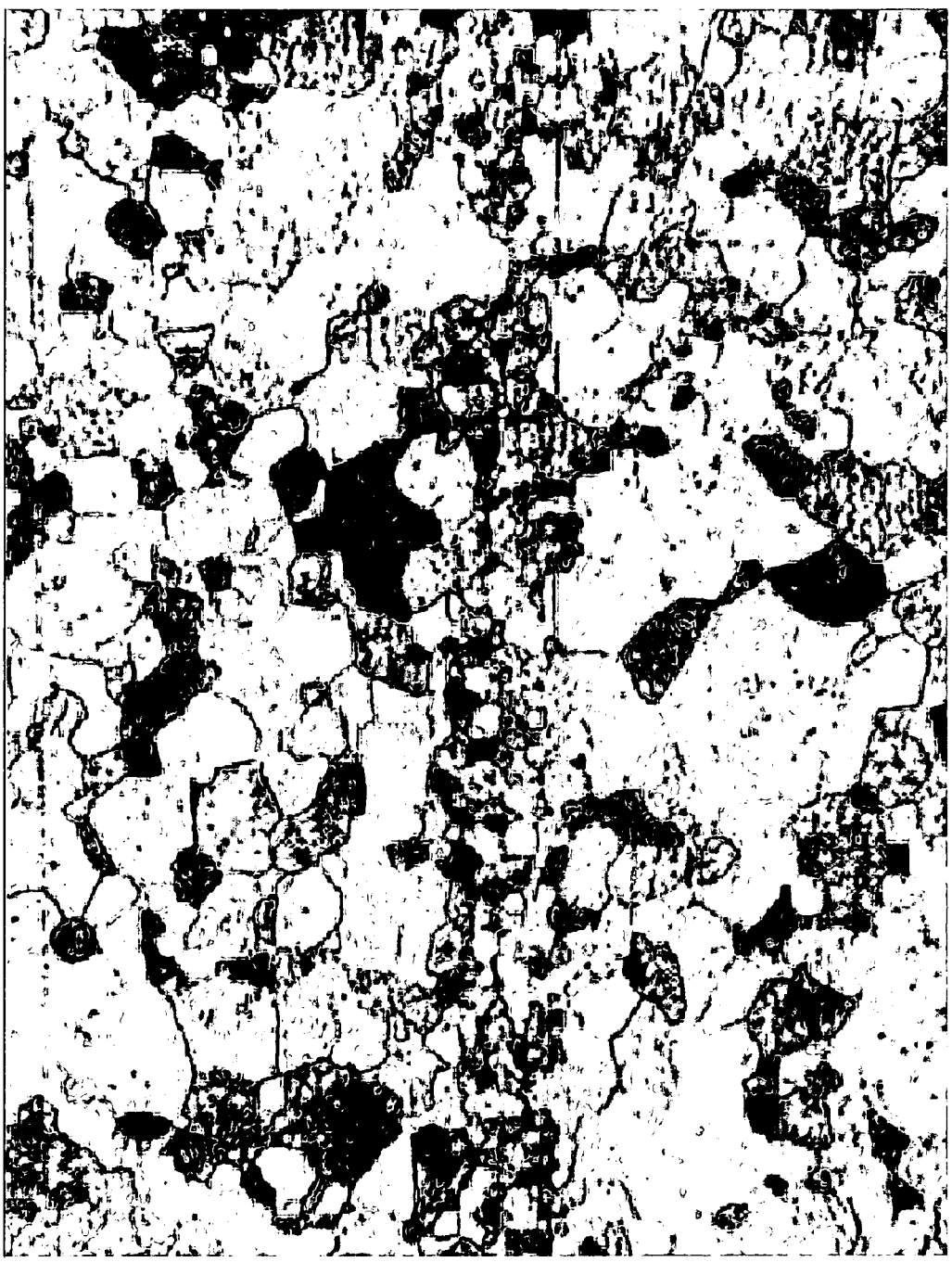
FIG. 2 is a photomicrograph at 100× of a metal-to-metal diffusion bond joint between plate-shaped sintered Mo powder metal bricks.

For purposes of illustration and not limitation, each HIP can may have internal dimensions of 225 mm by 225 mm by 625 mm. Each HIP can is coated with alumina internally as a release agent. The HIP treatment produces a HIP'ed preform comprising a sandwich of two plate-shaped bricks diffusion bonded together at their inner mating major surfaces. FIG. 2 shows the diffusion bond achieved at the metal-to-metal joint of the plate-shaped bricks by the procedure set forth above.

The HIP'ed preforms are removed from the HIP vessel followed by machining of the outer flat major side surfaces of each preform sandwich to 180 to 220 RMS surface finish for purposes of illustration and not limitation. These outer flat major side surfaces correspond to outer top and bottom surfaces of the preform sandwich when it placed on a horizontal surface with the diffusion bonded inner surfaces parallel with the surface.

The next step in this method embodiment of the invention involves HIP'ing two or more preforms under special joint conditions in a second hot isostatic pressing operation to form a relatively large billet or bar for the sputtering target. For example, two preforms described above having their outer top and bottom major side surfaces machined and cleaned are placed in a HIP can as follows. A HIP can of low carbon steel sans top can cover is provided having internal dimensions of 225 mm by 225 mm with a height of 2300 mm. One preform is placed in the HIP can (sans top can cover) with its machined major side surface facing upwardly. Then, commercially available Mo metal powder is sprinkled on the upwardly facing machined major side surface of, as well as optionally around edges, of the first preform in the HIP can. For purposes of illustration and not limitation, the Mo metal powder is placed as a layer of uniform depth of about 3 mm on the first preform in the HIP can. The Mo powder metal forming the layer typically has an oxygen content of less than 1000 ppm by weight.

Then the second preform is placed in the HIP can (sans top can cover) with its machined major side surface facing downwardly toward the machined major side surface of the first preform with the Mo powder metal layer thereon so that the machined major side surface of the second preform contacts the Mo powder metal layer. Additional Mo metal powder is placed about the edges of the second (top) preform. This process continues with placement of additional preforms in the HIP can until the HIP can is full. The top cover of the HIP can having an evacuation stem then is welded to the can sidewall.

Before the second HIP'ing operation, the HIP can is leak tested using helium gas using stems welded on each end cover. Several of the leak-tested HIP cans each with the stacked performs therein are placed in a degas oven and heated to an appropriate temperature (e.g. 600 degrees F.) while evacuating the HIP cans (e.g. to less than $10^{-5}$ torr) via the stems until an appropriate leak rate (e.g. less than 100 microns per minute) is attained. The HIP can then are placed in a conventional HIP vessel and HIP'ed at temperature, pressure and time (e.g. 1236 degrees C. lower than the HIP temperature of the first HIP'ing operation) at a gas pressure of 1034 bar for 300 minutes) to effect diffusion bonding of the metal(Mo)-to-powder metal (Mo) layer-to-metal(Mo) at the joints between the preforms to form a billet or bar, although other HIP parameters may be used. The number and dimensions of the preforms HIP'ed in the second HIP'ing operation are selected to yield a desired large size the billet or bar suitable for the sputtering target.

The final HIP'ed billet or bar for the sputtering target exhibits a microstructure comprising equiaxed grains of desired small grain size (e.g. about 30 microns or less) and exhibits a low oxygen content of less than about 100 ppm (part per million by weight) as a result of use of low oxygen sintered Mo powder metal bodies and of the second HIP operation effecting diffusion of oxygen from the commercially available Mo powder metal at each joint between adjacent ingot bodies. For example, it is through the second HIP operation that the oxygen from the commercially available Mo powder metal joint diffuses into the low oxygen (less than 100 ppm O) ingot bodies, reducing the oxygen content in the joint to less than 100 ppm by weight. FIG. 1 shows the diffusion bond joint achieved at an initial metal(Mo)-to-powder metal (Mo) layer-to-metal(Mo) joint by the procedure set forth above. The billet or bar for the sputtering target thereby includes a diffusion bond joint where the Mo powder layer was formerly present at the preform joint.

Although certain embodiments of the invention have been described above, those skilled in the art will appreciate that the invention is not limited to these embodiments and that modifications and changes can be made therein without departing from the spirit and scope of the invention as set forth in the appended claims.

We claim:

1. Method of making a sputtering target comprising molybdenum, comprising forming a first preform by diffusion bonding adjacent sintered powder metal bodies comprising Mo together at a metal-to-metal joint in a hot isostatic pressing operation using gas pressure, forming a second preform by diffusion bonding adjacent sintered powder metal bodies comprising Mo together at a metal-to-metal joint in a hot isostatic pressing operation using gas pressure, and then diffusion bonding adjacent said first preform and said second preform together at a metal-to-powder metal layer-to-metal joint therebetween in a subsequent hot isostatic pressing operation using gas pressure wherein the powder metal layer comprises Mo.

2. The method of claim 1 wherein the powder metal layer has an oxygen content of less than about 1000 ppm by weight.

3. The method of claim 1 including machining the bonded first preform and second preform to form a sputtering target.

4. The method of claim 1 wherein the sintered powder metal bodies have an oxygen content of less than about 100 ppm by weight.

5. The method of claim 1 including machining the first preform and the second preform prior to the subsequent hot isostatic pressing operation to provide respective machined surfaces between which the metal powder layer is disposed.

6. Method of making a Mo-based sputtering target, comprising forming a first preform by diffusion bonding adjacent sintered powder metal Mo-based bodies having an oxygen content of less than about 100 ppm by weight together at a metal-to-metal joint in a hot isostatic pressing operation using gas pressure, forming a second preform by diffusion bonding adjacent sintered powder metal Mo-based bodies having an oxygen content of less than about 100 ppm by weight together at a metal-to-metal joint in a hot isostatic pressing operation using gas pressure, and then diffusion bonding adjacent said first preform and said second preform together at a metal-to-powder metal layer-to-metal diffusion joint therebetween in a subsequent hot isostatic pressing operation using gas pressure wherein the powder metal layer comprises Mo having an oxygen content less than about 1000 ppm by weight that diffuses during said subsequent hot isostatic pressing operation from the diffusion joint into said first preform and said second preform to provide an oxygen content at the diffusion joint of less than about 100 ppm by weight.

* * * * *